(12) United States Patent
Levy et al.

(10) Patent No.: US 7,278,089 B2
(45) Date of Patent: Oct. 2, 2007

(54) SYSTEM AND METHOD FOR ERROR DETECTION IN ENCODED DIGITAL DATA

(75) Inventors: Sharon Levy, Hadera (IL); Dov Kimberg, Newton, MA (US)

(73) Assignee: Intel Corporation, Santa Clara ( * ) Notice: Subject to any disclaimer, the term of this patent is extended or adjusted under 35 U.S.C. 154(b) by 0 days.

(21) Appl. No.: 10/974,799

(22) Filed: Oct. 28, 2004

(65) Prior Publication Data

US 2005/0060634 A1    Mar. 17, 2005

Related U.S. Application Data

(63) Continuation of application No. 09/995,796, filed on Nov. 29, 2001, now abandoned.

(51) Int. Cl.
*H03M 13/03* (2006.01)
(52) U.S. Cl. ............... 714/795; 714/794; 714/796; 714/788; 714/762; 375/262; 375/341; 369/59.22
(58) Field of Classification Search ........ 714/789–790, 714/794, 795, 755, 758, 786; 375/262, 341
See application file for complete search history.

(56) References Cited

U.S. PATENT DOCUMENTS

| | | | |
|---|---|---|---|
| 4,618,955 A | 10/1986 | Sharpe et al. | |
| 5,231,639 A * | 7/1993 | Matui | 714/792 |
| 5,687,184 A * | 11/1997 | Lorenz et al. | 714/704 |
| 5,949,796 A * | 9/1999 | Kumar | 370/529 |
| 6,034,996 A | 3/2000 | Herzberg | |
| 6,101,626 A * | 8/2000 | Morelos-Zaragoza et al. | 714/786 |
| 6,170,073 B1 | 1/2001 | Jarvinen et al. | |
| 6,396,423 B1 * | 5/2002 | Laumen et al. | 341/95 |
| 6,606,718 B1 * | 8/2003 | Bessios | 714/701 |
| 6,662,337 B1 | 12/2003 | Brink | |
| 6,714,912 B2 * | 3/2004 | Lee | 704/500 |
| 7,073,116 B1 * | 7/2006 | Settle et al. | 714/786 |

FOREIGN PATENT DOCUMENTS

EP           52463        *   8/1982

\* cited by examiner

*Primary Examiner*—Guy J. Lamarre
(74) *Attorney, Agent, or Firm*—Pearl Cohen Zedek Latzer LLP

(57) ABSTRACT

A receiver is to receive an encoded data block that was encoded using a convolutional encoder and includes source bits and error detection bits. The receiver may include a Viterbi decoder, a de-mapper and an error detection unit. The error detection unit is to determine whether an error correction capability of the Viterbi decoder is sufficient to recover the source bits from the encoded data block. The Viterbi decoder is to decode the encoded data block only if the encoded data block is not free of errors and if the error correction capability of the Viterbi decoder is sufficient to recover the source bits from the encoded data block.

27 Claims, 4 Drawing Sheets

SYSTEM AND METHOD FOR ERROR DETECTION IN ENCODED DIGITAL DATA

CROSS-REFERENCE TO RELATED APPLICATIONS

This application is a continuation of U.S. patent application Ser. No. 09/995,796, filed on Nov. 29, 2001 now abandoned.

FIELD OF THE INVENTION

The present invention relates generally to the field of digital communications. More specifically, the present invention relates to a system and method for providing error detection and/or error correction for digital data.

BACKGROUND OF THE INVENTION

It is common practice to embed error detection code, such as, for example, cyclic redundancy check ("CRC"), into digital data to be transmitted from a communication device, prior to encoding and transmitting the data. After the transmitted data is received by another communication device, it is common practice to decode the received encoded data by, for example, a Viterbi decoder, and to check the decoded data for errors using the error detection code.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
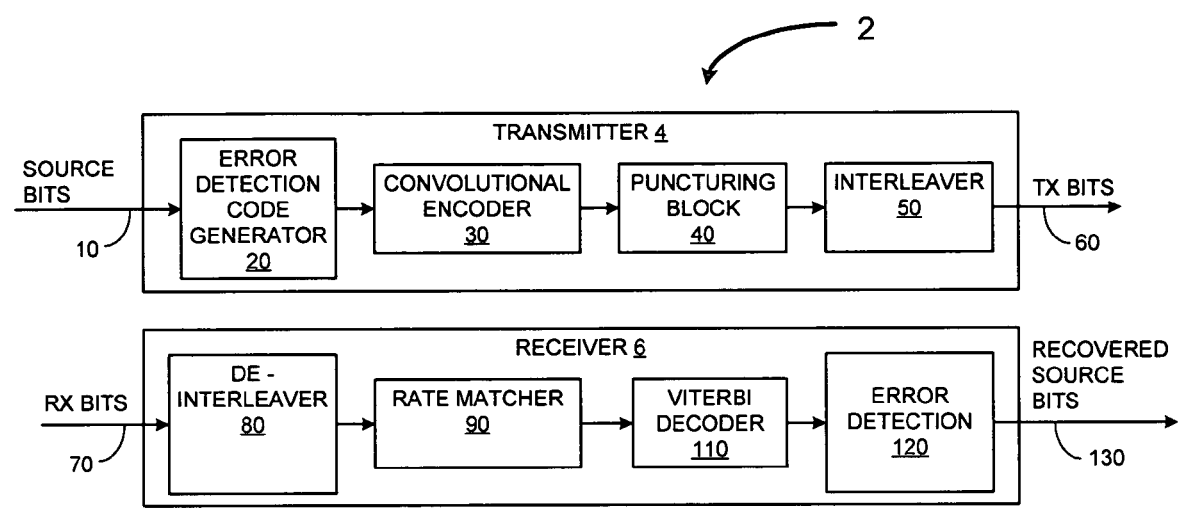
FIG. 1 is a block diagram of a communication system having a digital data transmitter and a digital data receiver according to the prior art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF EMBODIMENTS OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EE-PROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below In addition, embodiments of the present invention are not described with reference to any particular programming language. It will be appreciated that a variety of programming languages may be used to implement the teachings of the inventions as described herein.

FIG. 1 is a block diagram of a prior art communication system 2 having a digital data transmitter 4 and a digital data receiver 6. Transmitter 4 may receive source bits 10 as an input, and may transmit transmitted (Tx) bits 60, corresponding to source bits 10. Source bits 10 may be produced by any communications application or device. An error detection code generator 20 (e.g. cyclic redundancy code (CRC) generator) may generate one or more error detection bits or one or more error detection codewords which may be appended or inserted to the source bits. The combined source bits and error detection bits/codewords may then be encoded by a convolutional encoder 30 or by any functionally equivalent encoder. The encoded data may be separated into blocks and transmitter after being punctured by a puncturing block 40 and interleaved by an interleaver 50.

Receiver 6 may receive as an input Received (Rx) bits 70, that may be an accurate or a corrupted duplication of Tx bits 60, and may attempt to recover source bits 10 from Rx bits 70, and to output recovered source bits 130. In order to recover source bits 10 from Rx bits 70, receiver 6 may include a de-interleaver 80, a rate matcher 90, a Viterbi decoder 110 and a error detection unit 120. De-interleaver 80 may receive blocks of Rx bits 70 and may, for example, reverse the operation of interleaver 50. Rate matcher 90 may receive the output of de-interleaver 80 and may, for example, reverse to operation of puncturing block 40. Viterbi decoder 110 may receive the output of rate matcher 90 and may output decoded blocks of bits, that may be checked for errors, and optionally corrected, by error detection unit 120. Error detection unit 120 may output recovered source bits 130.

Figure 2:
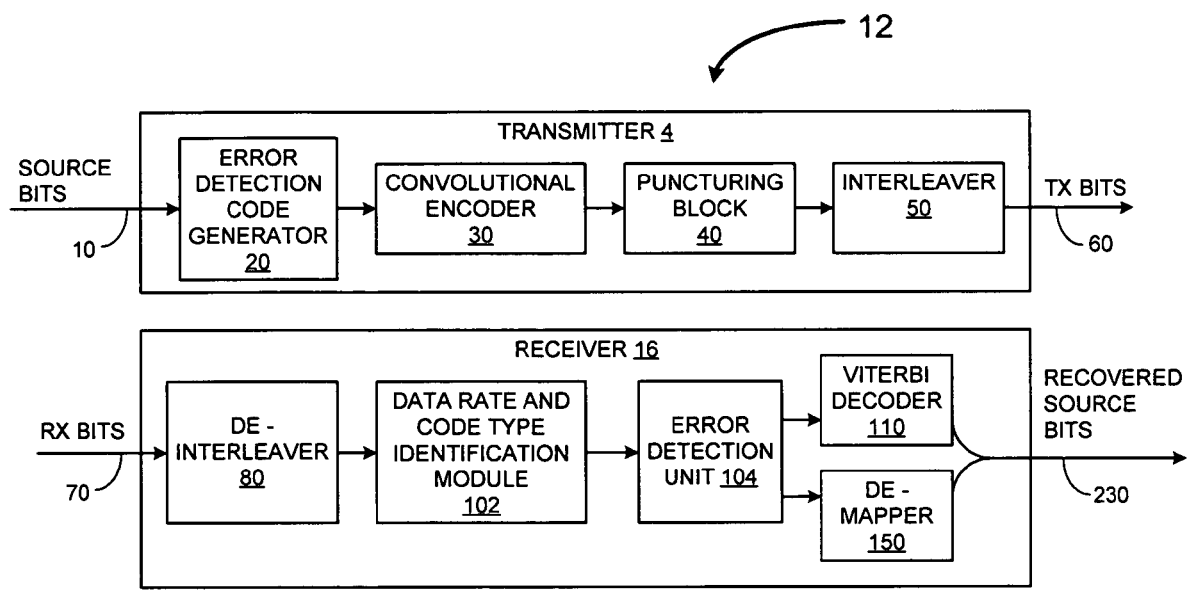
FIG. 2 is a block diagram of a communication system having a digital data transmitter and a digital data receiver according to some embodiments of the present invention.
Figure 4:
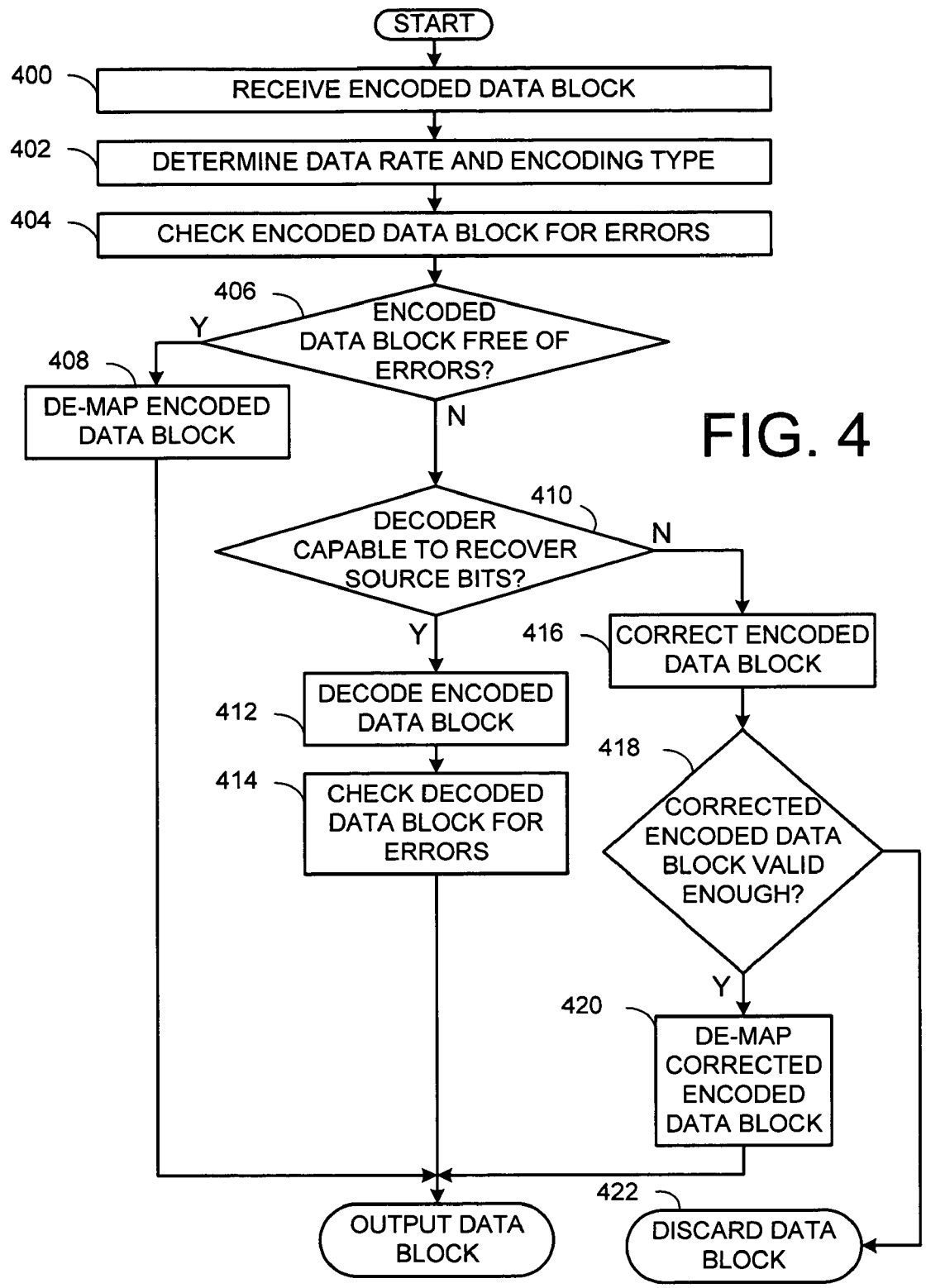
FIG. 4 is a flow chart of an exemplary method to recover source bits of a received encoded data block according to some embodiments of the present invention.

FIG. 2 is a block diagram of a communication system 12 having digital data transmitter 4 and a digital data receiver 16, according to some embodiments of the invention. Reference is made in addition to FIG. 4, which is a flow chart of an exemplary method to recover source bits 10 of a received encoded data block according to some embodiments of the present invention.

Receiver 16 may receive as an input Received (Rx) bits 70 (400), and may attempt to recover source bits 10 from Rx bits 70, and to output recovered source bits 230. Receiver 16 may include de-interleaver 80, Viterbi decoder 110, a de-mapper 150, a data rate and code type identification module 102 and an error detection unit 104. Data rate and code type identifier 102 may receive the output of de-interleaver 80, may attempt to identify the coding scheme used by convolutional decoder 30, and may attempt to identify the percentage of error detection bits embedded in Rx bits 70 (402). Error detection unit 104 may receive the encoded data block, the identified percentage of error detection bits and the identified code type from data rate and code type identification module 102. In accordance with the identified percentage of error detection bits and the identified code type, error detection unit 104 may check the encoded data block for errors (404). If the encoded data block is free of errors (406), error detection unit 104 may forward the encoded data block to de-mapper 150, which may de-map the encoded data block (408) and may output recovered source bits 230.

However, if the data block is not free of errors, the method may bypass box (410) (to be later explained), and error detection unit 104 may forward the data block to Viterbi decoder 110, that may decode the data block (412) to generate recovered source bits 230. If the amount of errors in the data block is relatively high, Viterbi decoder 110 may not be capable to recover all source bits 10 from the data block. Therefore, additional error checking may be performed on the decoded data block to verify validity of the data block after decoding (414).

Figure 3:
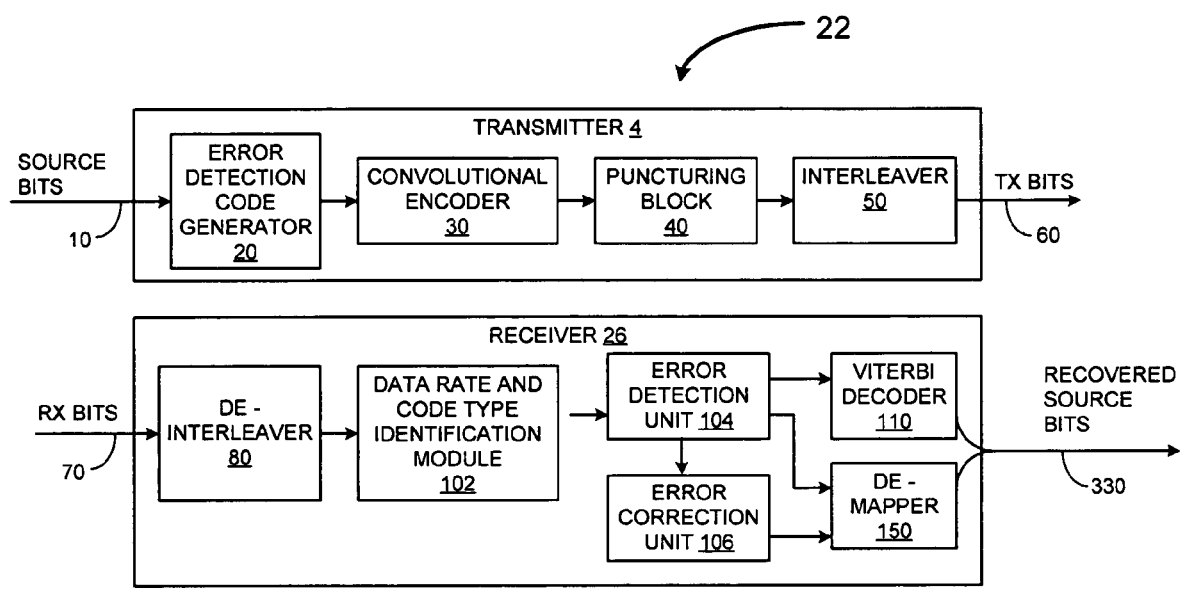
FIG. 3 is a block diagram of an error detection and correction unit according to some embodiments of the present invention.

Reference is now made to FIG. 3, which is a block diagram of a communication system 22 having digital data transmitter 4 and a digital data receiver 26, according to some embodiments of the invention. Reference is made in addition to FIG. 4. Receiver 26 may receive as an input Received (Rx) bits 70 (400), and may attempt to recover source bits 10 from Rx bits 70, and to output recovered source bits 330. Receiver 26 may be similar to receiver 16, however, receiver 26 may include an additional error correction unit 106. Receiver 26 may perform boxes (400), (402), (404), (406), (412) and (414) of the method of FIG. 4 similarly to receiver 16. However, if the encoded data block is found not to be free of errors at box (406), the method may proceed to box (410) to determine whether Viterbi decoder 110 is capable of recovering source bits 10 from the encoded data block. The decision in box (410) may be related to, for example, the identified percentage of error detection bits arid/or the identified code type of the encoded data block. If the error correction capabilities of the code are sufficiently strong. Viterbi decoder 110 may be used to recover source bits 10 from the encoded data block, and the method may continue to box (412). If, however, the error correction code capabilities are not sufficient, error correction unit 106 may try to correct the encoded data block using the CRC bits or codewords (416). Error correction unit 106 may decide whether the corrected encoded data block is valid enough for the Viterbi decoder to recover source bits 10 from the corrected encoded data block (418). For example, if the number of corrected bits in the corrected encoded data block is over a predefined threshold, the corrected encoded data block may not be valid. If the corrected encoded data block is not valid enough, the method may discard the data block (422). Otherwise, the corrected encoded data block may be de-mapped by de-mapper 150 (420) and outputted from receiver 26.

While certain features of the present invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus comprising:
 a receiver to receive an encoded data block encoded by a first code type that includes source bits and error detection bits, wherein said error detection bits are determined by a second code type, the receiver comprising:
  a data rate and code type identification module, to identify said first code type used in encoding the encoded data block and a percentage of said error detection bits of said second code type in the encoded data block; and
  an error detection unit, operably coupled to said data rate and code type identification module, to detect errors of the encoded data block based on the first code type and the percentage of error detection bits of said second code type identified by said data rate and code type identification module.

2. The apparatus of claim 1, wherein the receiver further comprises a de-mapper, operably coupled to said error detection unit, to de-map the encoded data block if the encoded data block is free of errors.

3. The apparatus of claim 1, wherein the receiver further comprises an error correction decoder, operably coupled to said error detection unit, to decode the encoded data block and to recover the source bits, if the encoded data block is not free of errors.

4. The apparatus of claim 3, wherein said error detection unit is to detect errors of the encoded data block prior to decoding of the encoded data block by said error correction decoder.

5. The apparatus of claim 3, wherein said error correction decoder is a Viterbi decoder.

6. The apparatus of claim 1, wherein the encoded data block includes bits that were encoded according to an error correction code, and wherein said error detection unit is to determine whether an error correction capability of said error correction code is sufficient to recover the source bits from the encoded data block.

7. The apparatus of claim 6, wherein said error detection unit is to determine whether said error correction capability is sufficient based on at least the first code type and the percentage of error detection bits of said second code type identified by said data rate and code type identification module.

8. The apparatus of claim 6, wherein said receiver comprises an error correction decoder, operably coupled to said error detection unit, and wherein said error detection unit is to provide the encoded data block to the error correction decoder if said error correction capability is determined to be sufficient.

9. The apparatus of claim 6, wherein the receiver further comprises an error correction unit, operably coupled to said error detection unit, and wherein the error detection unit is to provide the encoded data block to the error correction unit if said error correction capability is determined to be insufficient.

10. A system comprising:
a transmitter to transmit an encoded data block encoded by a first code type that includes source bits and error detection bits, wherein said error detection bits are determined by a second code type; and
a receiver to receive the encoded data block, the receiver comprising;
a data rate and code type identification module, to identify said first code type used in encoding the encoded data block and a percentage of said error detection bits of said second code type in the encoded data block; and
an error detection unit, operably coupled to said data rate and code type identification module, to detect errors of the encoded data block based on the first code type and the percentage of error detection bits of said second code type identified by said data rate and code type identification module.

11. The system of claim 10, wherein the receiver further comprises a dc-mapper, operably coupled to said error detection unit, to de-map the encoded data block if the encoded data block is free of errors.

12. The system of claim 10, wherein the receiver further comprises an error correction decoder, operably coupled to said error detection unit, to decode the encoded data block and to recover the source bits, if the encoded data block is not free of errors.

13. The system of claim 12, wherein said error detection unit is to detect errors of the encoded data block prior to decoding of the encoded data block by said error correction decoder.

14. The system of claim 12, wherein said error correction decoder is a Viterbi decoder.

15. The system of claim 10, wherein the encoded data block includes bits that were encoded according to an error correction code, and wherein said error detection unit is to determine whether an error correction capability of said error correction code is sufficient to recover the source bits from the encoded data block.

16. The system of claim 15, wherein said error detection unit is to determine whether said error correction capability is sufficient based on at least the first code type and the percentage of error detection bits of said second code type identified by said data rate and code type identification module.

17. The system of claim 15, wherein said receiver comprises an error correction decoder, operably coupled to said error detection unit, and wherein said error detection unit is to provide the encoded data block to the error correction decoder if said error correction capability is determined to be sufficient.

18. The system of claim 15, wherein the receiver further comprises an error correction unit, operably coupled to said error detection unit, and wherein the error detection unit is to provide the encoded data block to the error correction unit if said error correction capability is determined to be insufficient.

19. A method comprising:
receiving an encoded data block encoded by a first code type that includes source bits and error detection bits, wherein said error detection bits are determined by a second code type;
identifying said first code type used in encoding the encoded data block and a percentage of said error detection bits of said second code type in the encoded data block; and
detecting errors of the encoded data block based on said first code type and said percentage of error detection bits of said second code type.

20. The method of claim 19, further comprising de-mapping the encoded data block, if the encoded data block is free of errors.

21. The method of claim 19, further comprising decoding the encoded data block and recovering said source bits, if the encoded data block is not free of errors.

22. The method of claim 21, comprising detecting errors of the encoded data block prior to decoding the encoded data block.

23. The method of claim 21, wherein decoding the encoded data block comprises decoding by a Viterbi decoder.

24. The method of claim 19, wherein the encoded data block includes bits that were encoded according to an error correction code, and wherein the method comprises determining whether an error correction capability of said error correction code is sufficient to recover the source bits from the encoded data block.

25. The method of claim 24, wherein determining whether said error correction capability is sufficient comprises determining based on at least said first code type and said percentage of error detection bits of said second code type.

26. The method of claim 24, comprising providing the encoded data block to an error correction decoder if said error correction capability is determined to be sufficient.

27. The method of claim 24, comprising providing the encoded data block to an error correction unit if said error correction capability is determined to be insufficient.

* * * * *